(12) United States Patent
Lee et al.

(10) Patent No.: US 6,605,539 B2
(45) Date of Patent: Aug. 12, 2003

(54) ELECTRO-MECHANICAL POLISHING OF PLATINUM CONTAINER STRUCTURE

(75) Inventors: Whonchee Lee, Boise, ID (US); Scott Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/994,668

(22) Filed: Nov. 28, 2001

(65) Prior Publication Data

US 2002/0052126 A1 May 2, 2002

Related U.S. Application Data

(62) Division of application No. 09/653,411, filed on Aug. 31, 2000.

(51) Int. Cl.⁷ .............................................. H01L 23/48
(52) U.S. Cl. ...................... 438/693; 438/690; 438/691; 438/692
(58) Field of Search .......................... 438/690, 691, 438/692, 693

(56) References Cited

U.S. PATENT DOCUMENTS

| | | | |
|---|---|---|---|
| 5,534,106 A | * | 7/1996 | Cote et al. .................. 438/693 |
| 5,911,619 A | * | 6/1999 | Uzoh et al. ..................... 451/5 |
| 5,952,687 A | * | 9/1999 | Kawakubo et al. ......... 257/296 |
| 6,413,388 B1 | * | 7/2002 | Uzoh et al. .................. 204/224 |

OTHER PUBLICATIONS

"Electrochemical Planarization for Multi-Level Metallization of Microcircuitry", *Circuitree*, Anthony F. Bernhardt et al., Oct. 1995, pp 38–48.

* cited by examiner

*Primary Examiner*—Richard Elms
*Assistant Examiner*—Christian D. Wilson
(74) *Attorney, Agent, or Firm*—Dickstein Shapiro Morin & Oshinsky LLP

(57) ABSTRACT

A method of patterning a metal surface by electro-mechanical polishing is described. A metal surface is placed in fluid communication with an abrasive surface of a pad. The two surfaces are moved relative to each other, in acidic fluid which contains abrasive particles. An electrical circuit is formed between the metal surface and abrasive pad and a current is supplied to the circuit. The patterned surface then is processed into a useful feature such as a bottom electrode for a DRAM capacitor.

33 Claims, 9 Drawing Sheets

ELECTRO-MECHANICAL POLISHING OF PLATINUM CONTAINER STRUCTURE

This application is a divisional of application Ser. No. 09/653,411, filed on Aug. 31, 2000, which is hereby incorporated in its entirety by reference.

FIELD OF THE INVENTION

The present invention relates to a method of electro-mechanical polishing (EMP) surfaces, especially surfaces of platinum container structures, during semiconductor device fabrication.

BACKGROUND OF THE INVENTION

As the dimensions of semiconductor devices continue to decrease, there is a need for high resolution patterning of device features. The need for smaller surface area for components, such as capacitors or transistors, along with the requirement to maintain high-reliability electrical connections, have led researchers to seek new materials and methods for fabricating semiconductor components.

For example, promising candidates for materials for capacitor electrodes used in integrated circuits memory structures include noble metals, i.e., platinum (Pt), palladium (Pd), iridium (Ir), ruthenium (Ru), rhodium (Rh), osmium (Os), silver (Ag) and gold (Au), as wells as their oxides, e.g., ruthenium oxide ($RuO_2$), iridium oxide ($IrO_2$) or osmium oxide ($OsO_2$). The above-mentioned noble metals, of which platinum (Pt) is the most common, are all physically and chemically similar. They are either relatively stable metals or form conductive oxides. Their capacitance remains constant even when exposed to oxidizing or reducing atmospheres common to semiconductor fabrication. These metals are also resistant to hydrogen damage and do not affect the polarization of dielectric layers after annealing at high temperatures.

Recently, particular attention has been given to using platinum (Pt) for electrodes mainly because platinum has a very low reactivity and is inert to oxidation, thus preventing electrode oxidation which decreases a capacitor's capacitance. Platinum also has a high electrical conductivity and a lower leakage current than that of other electrode materials, such as for example, ruthenium oxide or poly-silicon. Further, platinum has a high work function. Work function is an important feature of an electrode material for a DRAM capacitor and is a measure of the energy required to remove one electron from the metal. Advanced DRAM capacitors are characterized by a dominant current leakage mechanism, known as the Schottky emission from the electrode into the dielectric so that metals with high work functions, like platinum, produce less current leakage.

The use of platinum as the material of choice for capacitor electrodes, however, poses significant problems. One problem arises from the difficulty of etching and/or polishing platinum and the corresponding need to precisely etch the platinum into the shape of the desired capacitor electrode. The etching process, which is repeated many times in the formation of semiconductor devices, typically employs at least one chemical etchant that reacts with, and removes, the film or layer that is etched. Noble metals such as platinum, however, are not highly reactive with conventional chemical etchants. Consequently, noble metals require specialized etching methods and/or highly-reactive chemical etchants in the etching process.

Two methods are currently being used to etch platinum. The first method is isotropic etching, such as wet etching with aqua regia (mix ratio of concentrated hydrochloric acid: concentrated nitric acid: water=3:1:4). This wet etching, however, offers a very low degree of precision. Consequently, wet etching is not accurate enough for many fine pattern processes, such as patterning DRAM devices, rendering it difficult to perform submicron patterning of platinum electrodes.

The second method is anisotropic etching, such as ion beam milling, under which ions, e.g., argon ions, are generated by a magnetically confined RF or DC plasma and bombard an exposed platinum surface. While the ion beam milling process is used to define and form high resolution patterns from a blanket platinum layer, this process is typically not selective to many masking materials as well as to the layers underlying the platinum layer. Further, ion beam milling processing removes most materials at about the same rate, making process control very difficult as the ion beam may remove material underlying a protective mask as well as unwanted material.

Accordingly, there is a need and desire for an improved method of patterning metal surfaces during the formation of semiconductor device components, e.g., capacitors. There is also a need and desire for high-resolution patterning of noble metal layers, e.g., platinum, during the formation of a lower capacitor electrode, as well as a method of increasing the processing accuracy in etching a noble metal surface.

SUMMARY OF THE INVENTION

The present invention provides a method for patterning metal surfaces employed in the formation of various semiconductor device components, such as capacitors, as well as a method for increasing processing accuracy in polishing metal surfaces.

In an exemplary embodiment, a metal surface is patterned by electro-mechanical polishing to form the bottom electrode of a DRAM capacitor. To form the bottom electrode, an insulating layer is formed over a contact plug that is in electrical contact with a transistor gate stack. A container opening is formed in the insulating layer to expose the contact plug. A metal layer is deposited in the container structure and on the exposed surface of the insulating layer. A photoresist layer is deposited over the metal layer, forming a plug in the container. The photoresist layer is chemically mechanically polished to expose the surface of the metal layer outside the container. The surface of the metal layer outside the container structure is electro-mechanically polished against a second surface while submersed in an electrolytic bath. The metal surface and polishing pad are connected to an electrical source and a current is supplied to them during polishing. The metal surface is polished until the metal outside the container is removed. The photoresist is removed from the container exposing the surface of the metal surface inside the container. In an exemplary embodiment, platinum is used as the metal layer.

BRIEF DESCRIPTION OF THE DRAWINGS

The foregoing and other advantages and features of the invention will become more apparent from the detailed description of the preferred embodiments given below with reference to the accompanying drawings in which.

DETAILED DESCRIPTION OF THE PREFERRED EMBODIMENTS

Figure 1:
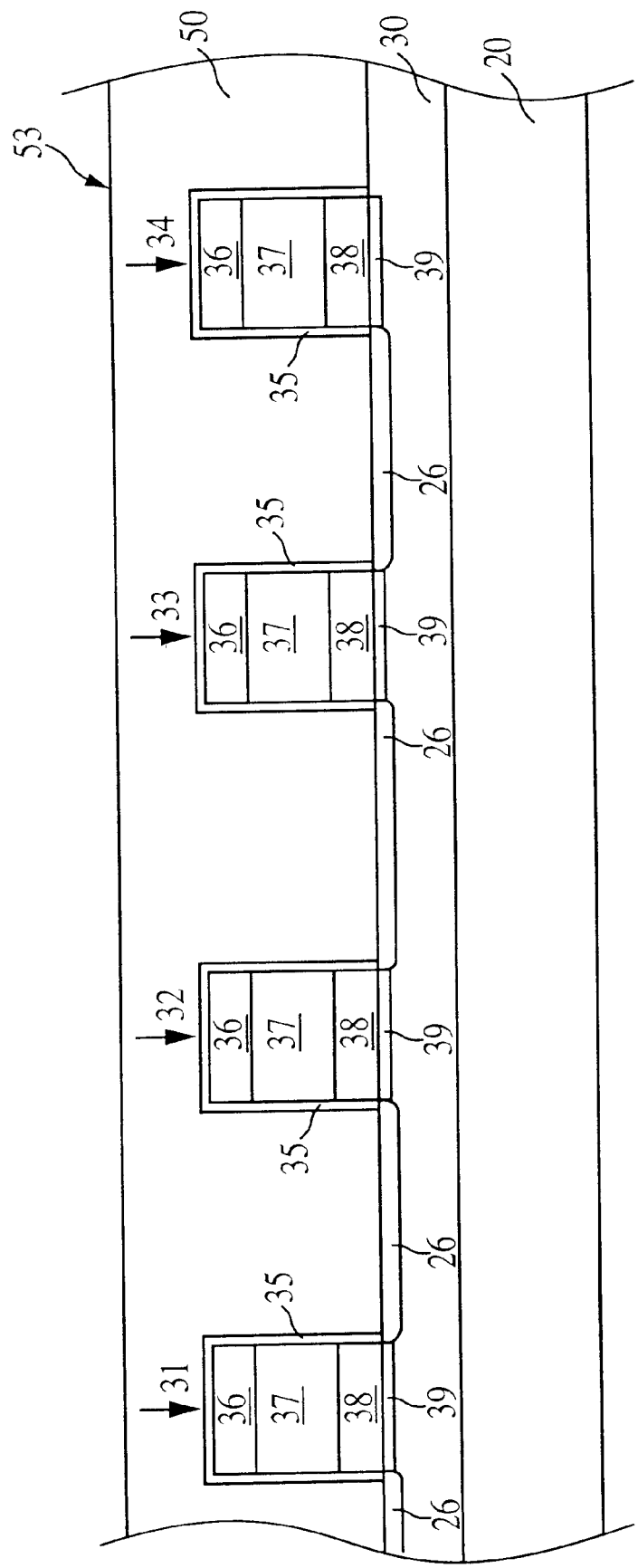
FIG. 1 is an illustration of a DRAM CMOS gate structure, upon which a capacitor bottom electrode will be formed according to a method of the present invention.

The present invention will be described as set forth in the preferred or exemplary embodiments of the detailed description and as illustrated in FIGS. 1–13. These embodiments are described with sufficient detail to enable those skilled in the art to practice the invention, and it is to be understood that other embodiments may be employed, and that structural, logical, and electrical changes may be made without departing from the spirit or scope of the present invention.

The term "substrate" used in the following description may include any semiconductor-based structure that has an exposed silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "noble metal" is intended to include not only elemental noble metals, i.e., platinum (Pt), palladium (Pd), iridium (Ir), ruthenium (Ru), rhodium (Rh), osmium (Os), silver (Ag), gold (Au), and their oxides, but also noble metals with other trace metals or in various alloyed combinations with other metals as known in the semiconductor art, as long as such alloys retain the physical and chemical properties of the noble metal.

The term "refractory metal" is intended to include metals which offer low contact resistance and includes not only elemental refractory metals but refractory metals with other trace metals or in various alloyed combinations with other metals as known in the semiconductor art, as long as such alloy retain the physical and chemical properties of the refractory metals. Refractory metals and their nitrides of particular interest are titanium (Ti), tungsten (W), tantalum (Ta), molybdenum (Mo), titanium nitride (TiN), tungsten nitride (WN), and tantalum nitride (TaN).

The present invention provides a method for patterning metal surfaces, such as noble and refractory metals, during the formation of integrated circuit components, such as capacitors, transistors, resistors, conductor layers, conductive plugs, metalization layers, gate metals, interconnects, electrodes, electrical contacts, electrical vias, and bonding pads. The invention uses electro-mechanical polishing (EMP) for the high-resolution patterning of a metal surface to form various geometric features of semiconductor memory structures. In one exemplary embodiment, the feature is a capacitor bottom electrode. The method of the present invention also improves the processing accuracy in patterning such metals. The invention is described in relation to an exemplary embodiment in which EMP is used to form a bottom electrode of a capacitor of a DRAM device. It should be noted, however, that the EMP method could be used on numerous metal surfaces of integrated circuit devices and is not limited by the description of the exemplary embodiment.

Referring now to the drawings, where like elements are designated by like reference numerals, FIG. 1 illustrates a DRAM memory cell at an intermediate stage of fabrication, in which a pair of capacitor memory cells 86, 87 (FIG. 12) having respective access transistors 32, 33 are to be formed on a substrate 20. The FIG. 1 structure includes a well 30 in the upper portion of the substrate 20, which is typically doped to a predetermined conductivity, e.g., p-type or n-type depending on whether NMOS or PMOS transistors will be formed therein. Also shown are field oxide regions 26, for use as source/drain regions, and four gate stacks 31–34 formed according to well-known semiconductor processing techniques. Each gate stack 31–34 includes a gate oxide region 39, gate electrode 38, conductive layer 37, cap layer 36, and an insulating layer or gate stack spacer 35. The insulating layers 35 and field oxide regions 26 are covered with a second insulating layer 50, which could be, for example, silicon oxide (SiOx), borophosphosilicate glass (BPSG), borosilicate glass (BSG), phosphosilicate glass (PSG) or other suitable materials. After depositing insulating layer 50, the upper surface 53 of insulating layer 50 may undergo a chemical mechanical polishing (CMP) step. Any CMP technique can be used to polish the upper surface 53.

Figure 2:
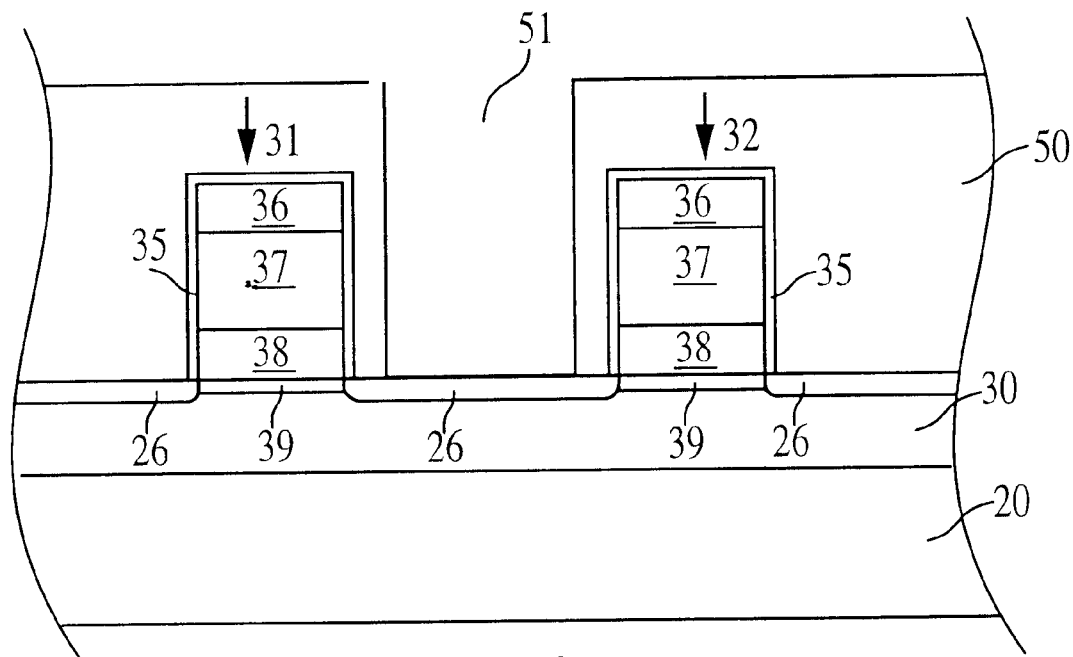
FIG. 2 is a partial view of the FIG. 1 structure at a stage of processing subsequent to that shown in FIG. 1.

Reference is now made to FIG. 2, which for simplicity illustrates only one transistor gate stack pair 31, 32 from FIG. 1. This is a region where a contact plug 52 (FIG. 3) and an overlying capacitor structure 86 (FIG. 12), including a capacitor bottom electrode 73 (FIG. 12) will be formed according to a method of the present invention. One method to create contact opening 51 (through insulating layer 50 to source/drain region 26) is to deposit a photoresist material on layer 50 and pattern the opening using conventional photolithography steps. After patterning, opening 51 is formed in the photoresist material and insulating layer 50 using well known techniques. After the opening is formed, the remaining photoresist material is removed using known techniques. Opening 51 extends to source/drain region 26 of well 30 between gate stacks 31, 32.

Figure 3:
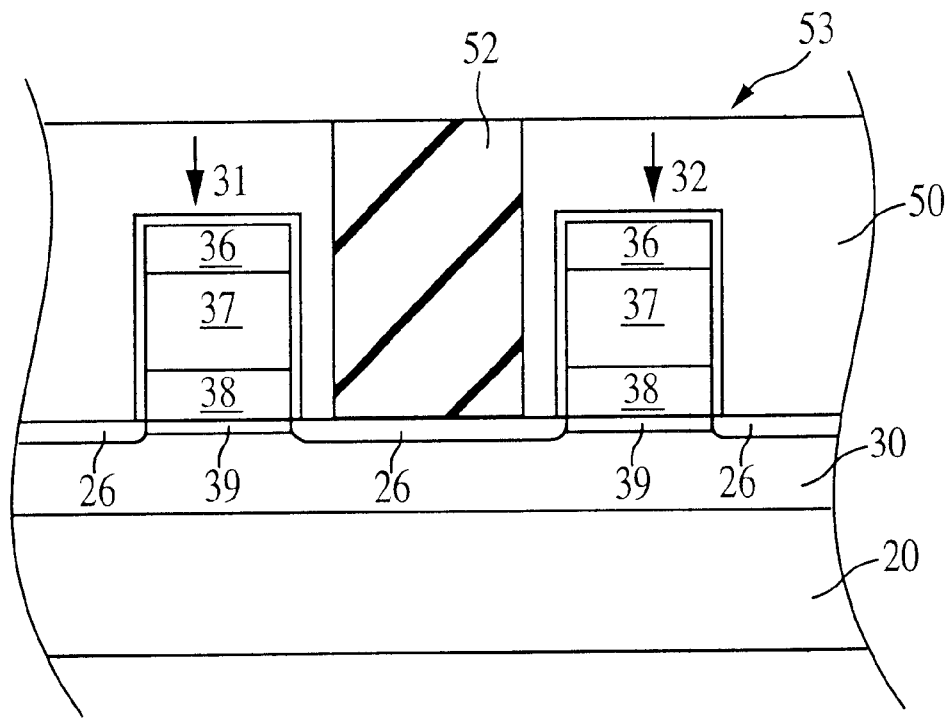
FIG. 3 is a view of the FIG. 1 structure at a stage of processing subsequent to that shown in FIG. 2.

Referring to FIG. 3, opening 51 is filled with a conductive material, such as doped polysilicon, to form a contact plug or contact filler 52. After conductive layer is deposited it is planarized down to insulating layer upper surface 53. The contact plug 52 can optionally be formed in multiple-layers to include a conductive barrier layer at the top of plug 52.

Figure 4:
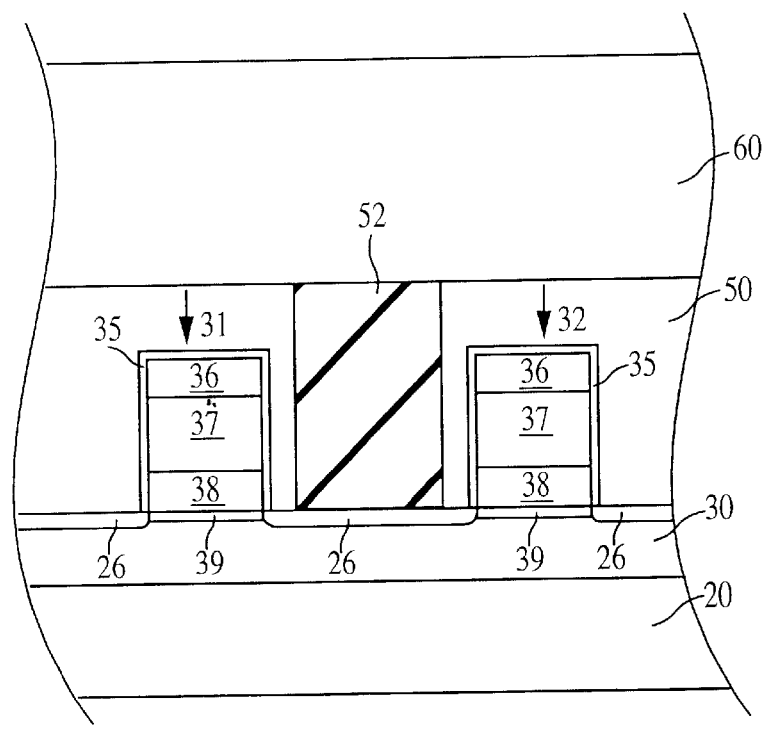
FIG. 4 is a view of the FIG. 1 structure at a stage of processing subsequent to that shown in FIG. 3.
Figure 5:
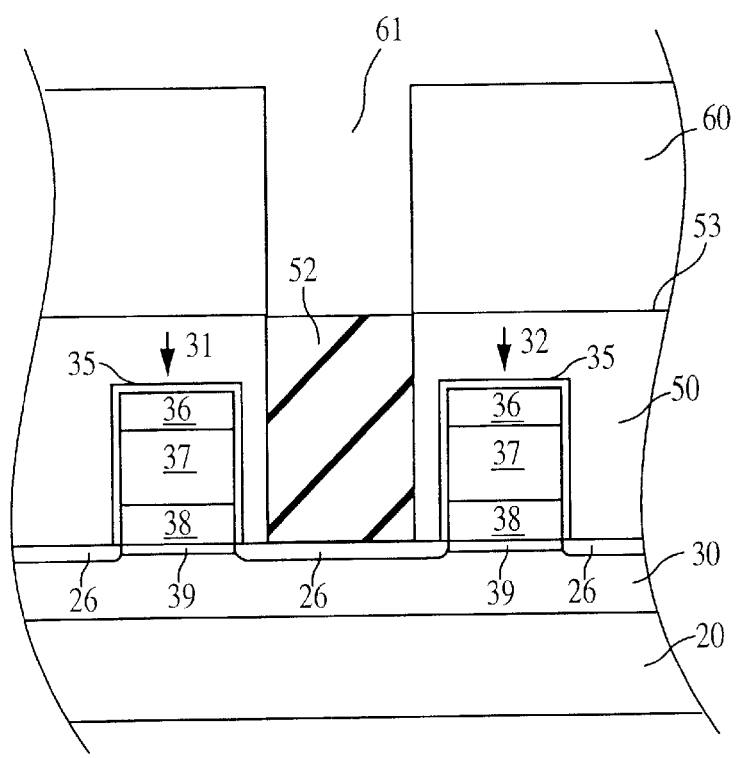
FIG. 5 is a view of the FIG. 1 structure at a stage of processing subsequent to that shown in FIG. 4.

FIG. 4 illustrates the deposition of insulating layer 60, which could be, for example, a silicon oxide (SiOx), borophosphosilicate glass (BPSG), borosilicate glass (BSG), phosphosilicate glass (PSG), or tetraethylortho silicate (TEOS). The third insulating layer 60 is deposited over contact plug 52 and second insulating layer 50. Referring to FIG. 5, using the same fabrication technique as that used for the formation of contact opening 51 (FIG. 2) or other techniques, an opening 61 is formed through insulating layer 60.

Figure 6:
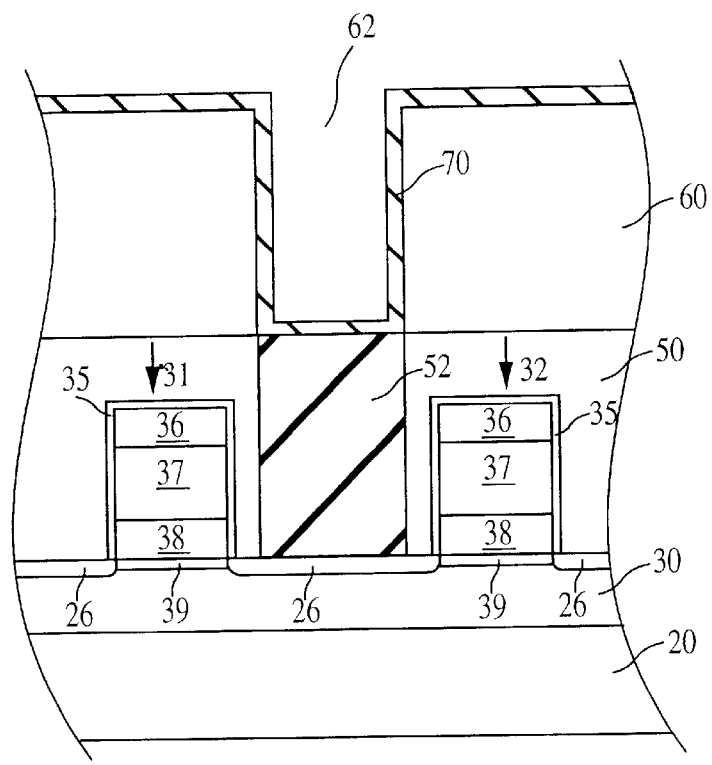
FIG. 6 is a view of the FIG. 1 structure at a stage of processing subsequent to that shown in FIG. 5.

Referring to FIG. 6, after forming opening 61, metal layer 70 is deposited over insulating layer 60 and into opening 61. Although any of the metals mentioned above, along with their alloys and oxides, may be used for forming metal layer 70, it is desirable to use platinum. A portion of metal layer 70 will form the bottom electrode 73 (FIG. 11) of capacitors 86, 87 (FIG. 12). Metal layer 70 could be formed over conductive plug 52 by any conventional method, such as chemical vapor deposition or sputtering, to a thickness of approximately 1000 Angstroms or less, preferably less than 500 Angstroms. Optionally, metal layer 70 could completely fill opening 61 to form a plug type bottom electrode (not shown).

Figure 7:
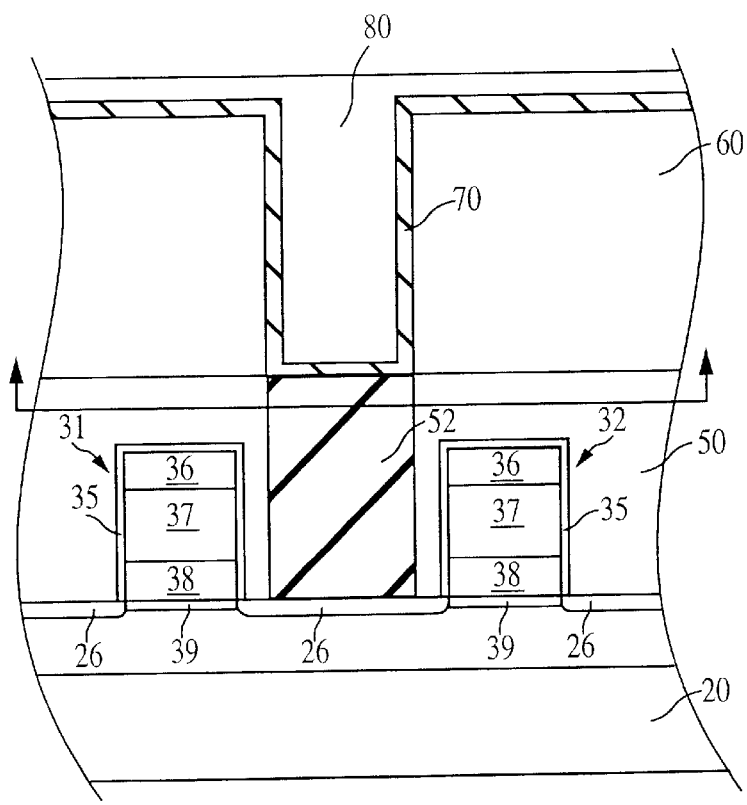
FIG. 7 is a view of the FIG. 1 structure at a stage of processing subsequent to that shown in FIG. 6.
Figure 8:
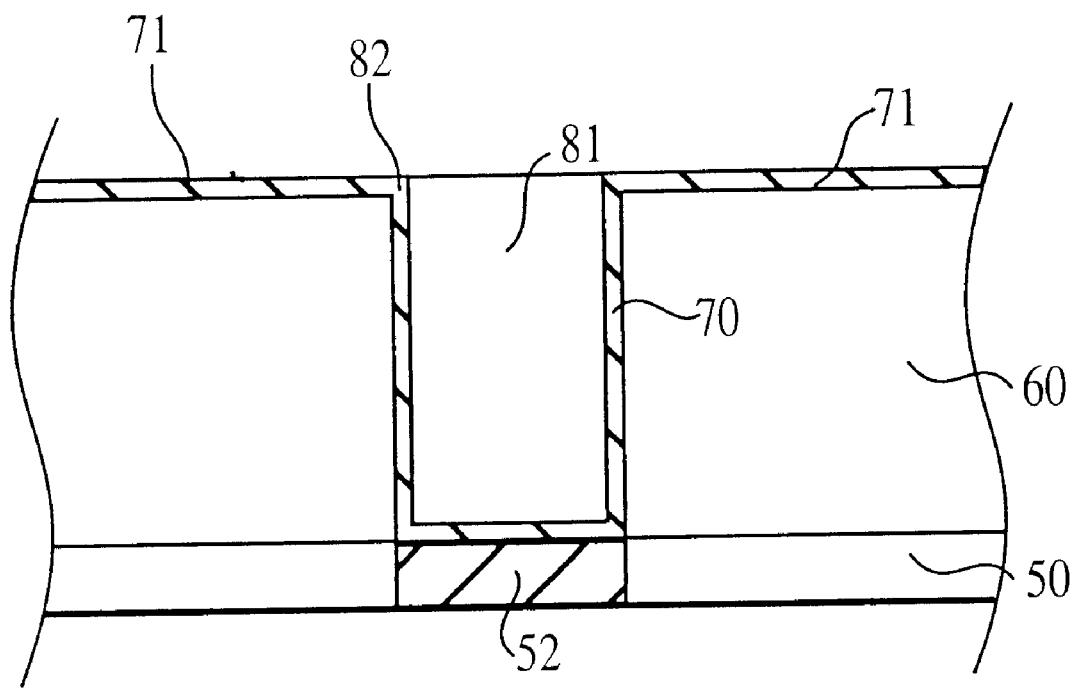
FIG. 8 is a view of the FIG. 1 structure at a stage of processing subsequent to that shown in FIG. 7.

Referring now to FIG. 7, opening 62 (FIG. 6) is filled with a photoresist material 80, for example, by spin coating the material 80 at room temperature and then solidifying it. The photoresist material 80, which can be any photochemical resin used in the semiconductor industry, may then be planarized by CMP down to or near planar surface 82 of metal layer 70 to form photoresist plug 81 (FIG. 8). The photoresist plug 81 acts as a protective cover for metal layer 70 located inside opening 62. The photoresist plug 81 does not protect, however, region 71 of metal layer 70 located outside the opening 62. It should be noted that photoresist is optional and metal layer 70 can undergo the EMP directly as described below in accordance with FIG. 9.

After formation of the photoresist plug 81, planar surface 82 undergoes EMP in polishing system 200 (FIG. 9) to remove a region 71 of metal layer 70 to form bottom electrode 73 of capacitors 86, 87 (FIG. 12). To understand the electrical mechanical polishing method of the present invention, a brief description of prior art electropolishing process is provided. Electropolishing, also called "reversed plating," is the electrolytic removal of a metal material in a highly ionic solution by means of an electrical potential and current. Electropolishing is accomplished by connecting a metal surface to the negative terminal (the anode) of a power supply. The metal surface is then immersed in an electrolytic bath, for example, a hydrochloric acid bath, which could contain metal plates, which typically line the edges of the processing tank and are connected to the positive terminal (the cathode) of a power supply. Since the metal surface is electrically conductive, a closed circuit is formed and current is transferred to the surface of the metal.

In electropolishing, as the current is being applied, the metallic material reacts with the electrolytes from the electrolytic bath to form an anodic film. This film, essentially conforms to the general contour of the surface of the exposed metal surface. The anodic film is removed through chemical complexing reactions or mechanical force. It is important to note that as the metallic material thickness decreases, the resistance or insulation properties of the metallic material increase. Overall, the amount of metal removed depends upon the chemical composition of the metal, temperature and agitation of the electrolytic bath, spatial relationship of the anode and cathode, intensity of current, and the length of time the current is flowing and mechanical force applied.

Figure 9:
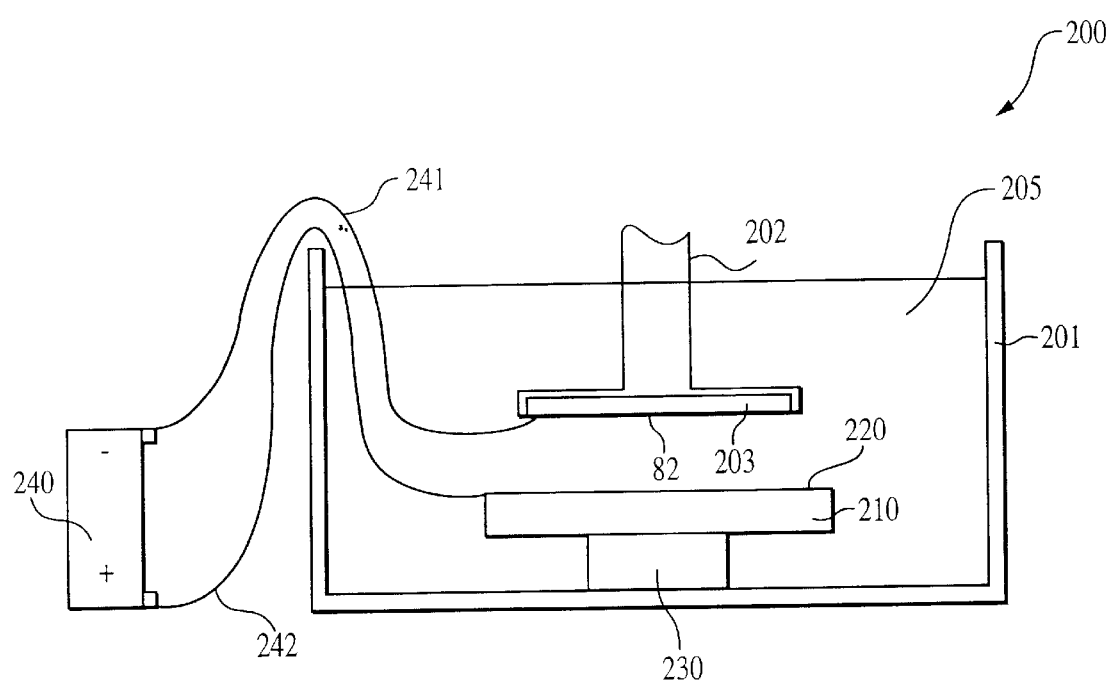
FIG. 9 is an illustration of an exemplary electro-mechanical polishing apparatus according to an embodiment of the present invention.

In a first exemplary embodiment, planar surface 82 (FIG. 8) undergoes EMP in polishing system 200 (FIG. 9). The wafer 203 containing planar surface 82 is inserted into a wafer holder 202 with surface 82 exposed. Wafer holder 202 is then inserted into tank 201 containing an electrolytic fluid or acidic solution 205, pad 210, and pad support 230. The wafer surface 82 is electrically connected to a negative terminal 241 of power source 240. The wafer holder 202 is lowered until exposed surface 82 contacts pad surface 220, which is electrically connected to positive terminal 242 of a power source 240. When the two surfaces 82 and 220 are touching a closed electrical circuit is formed with the power source 240. The power source 240 provides either a constant or pulsed current to the wafer surface 82 and pad surface 220. The amount of voltage will vary depending on the metal layer 70 thickness and polishing criteria. The wafer holder 202 may rotate in a random or fixed pattern relative to the pad surface 220. Optionally, pad surface 220 is stationary or moves in a random or fixed pattern relative to the wafer holder 202. A force may be applied to planar surface 82 by either the wafer holder 202, the abrasive pad 220 or both.

In another exemplary embodiment, the pad 210 contains fixed abrasive particles. The abrasive particles should have low solubility oxides in acidic solutions, such as cerium oxide ($CeO_2$) or silicon dioxide (SiOx). The abrasive pad 210 assists planarization by decreasing the boundary layer and/or increasing the stress at the sharpest surface of the metal surface 82. In general, the sharpest surface features sticking out through the boundary layer dissolve faster than metal not sticking out.

Figure 10:
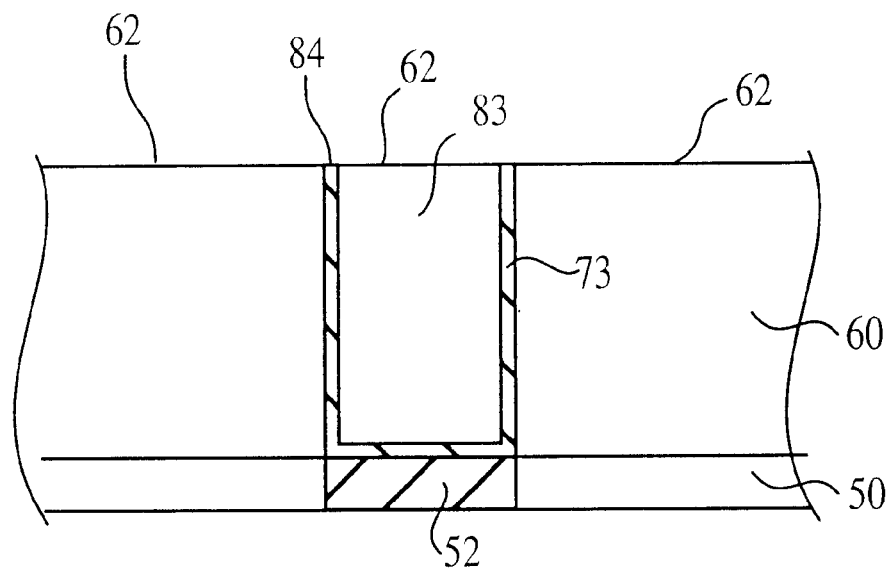
FIG. 10 is a view of the FIG. 1 structure at a stage of processing subsequent to that shown in FIG. 8.

In yet another exemplary embodiment, the fluid 205 may contain solid particles, such as polyeurthane, cerium oxide ($CeO_2$) or silicon dioxide (SiOx) and forms a slurry or viscous liquid. The fluid is preferably an acidic solution, such as a mixture of hydrogen chloride (HCl) and water ($H_2O$), at a ratio of 1 to 10 saturated in potassium chloride (KCl) solution. When the metal layer 70 is platinum (Pt), the anodic voltage will generate a thin layer of platinum oxide, which is subsequently dissolved as $PtCl_4^{2-}$ or other complex forms. Likewise, when fixed particles are placed on pad 210, secondary complex reactions can include $XOH_2ClPt$. It is to be understood that the given chemical composition of the electroylic fluid 205 is exemplary and additional compounds are within the scope of the invention It must be noted that planar surface 82 of FIG. 9 undergoes EMP for a time sufficient to allow the top surface 84 of bottom electrode 73 (FIGS. 10–12) to be recessed down to the planar surface 62 of insulating layer 60. After a suitable amount of polishing, as determined by endpoint controls such as coulometry, time, current, and visual techniques, the polishing is completed. The time for a 500 to 1000 angstrom thick platinum is preferably in the range of 30 to 200 seconds (depending upon the thickness and properties of metal surface 82). The wafer 203 is removed from the processing tank 201 and the wafer 203 is inserted into a first rinse tank (not shown), filled with deionized water, where the anode film is rinsed off by immersion. Next, the wafer 203 is taken to a second rinse station (not shown), also filled with deionized water, to remove any remaining traces of the anode film. The resulting structure after EMP is shown in FIG. 10. Metal region 71 (FIG. 8) was removed while portions of metal layer 70, protected by photoresist plug 83, remains.

Figure 11:
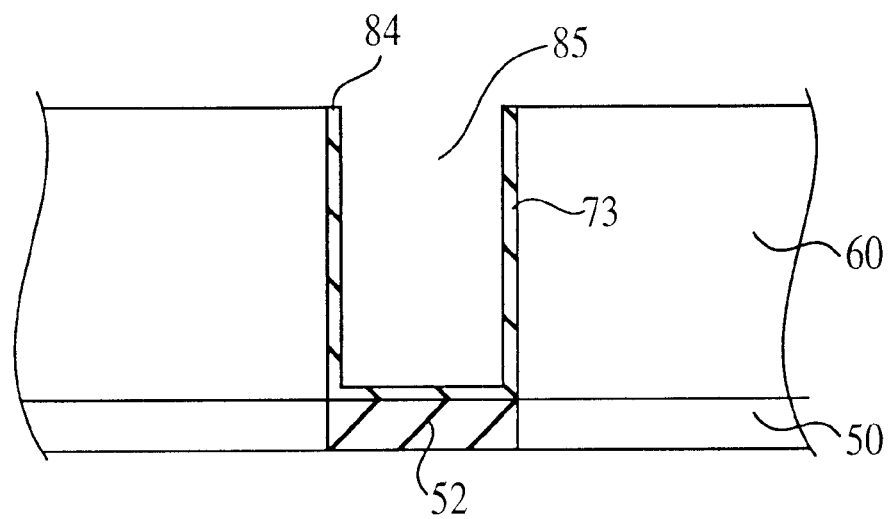
FIG. 11 is a view of the FIG. 1 structure at a stage of processing subsequent to that shown in FIG. 10.
Figure 12:
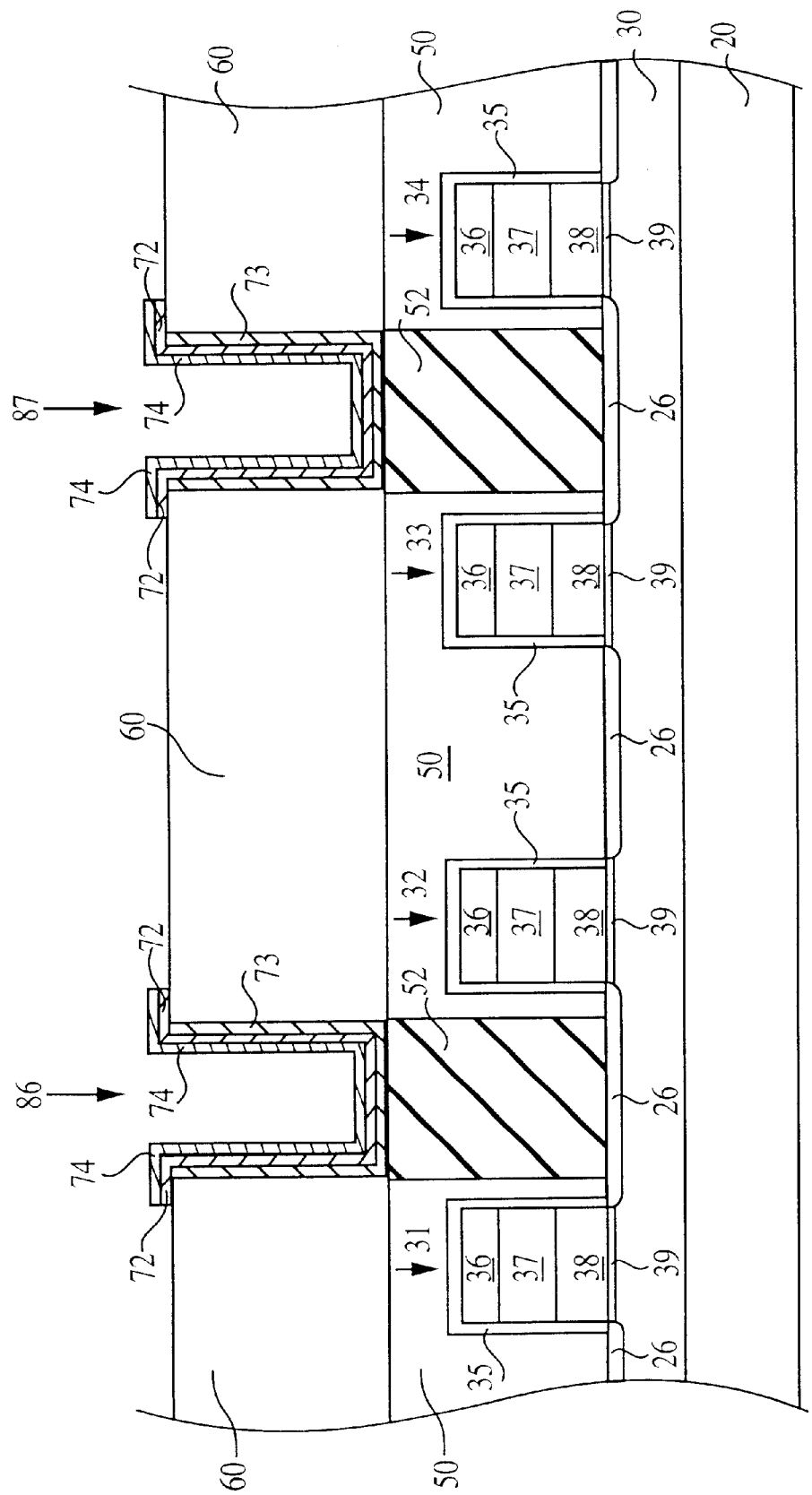
FIG. 12 is a view of two capacitors of a DRAM device formed according to a method of the present invention.

Next, photoresist plug 83 is removed using conventional techniques, such as ashing or etching, to form opening 85 (FIG. 11). Upon removal of the photoresist plug 83, the processing steps for the fabrication of capacitors 86, 87 (FIG. 12) proceed according to well-known methods. As such, a dielectric layer 72 (FIG. 12) can be formed over bottom electrode 73 (FIG. 12) by conventional methods, e.g., deposition or spin coating, to a thickness of about 100 Angstroms. Increasingly popular materials for the dielectric layer 72 are the ferroelectrics, such as PZT (lead, zirconatem, and titanate) or $BaTiO_2$ (barium titanite). However, other conventional insulating materials, such as silicon oxides, silicon nitrides, silicon oxynitrides or carbides, may be used also, in accordance with the processing requirements and the characteristics of the particular IC device. Further, high-dielectric constant materials, such as titanium oxide ($TiO_2$) barium oxide (BaO) tantalum oxide ($Ta_2O_5$) or ruthenium oxide ($Ru_2O_3$), may be used, according to the characteristics of the particular IC devices to be subsequently constructed.

Continuing, upper electrode 74 (FIG. 12) is formed overlying the dielectric layer 72 by any conventional method, such as deposition or sputtering, to a thickness of approximately 50 to 300 Angstroms, more preferably of about 100 Angstroms. The upper electrode 74 may be formed of a noble metal, such as platinum, or of any other suitable material previously listed for metal layer 70. Capacitors 86, 87 (FIG. 12) consists of bottom electrode 73, dielectric layer 72, and upper electrode 74. Further well-known processing steps to create a functional memory cell containing capacitors 85, 86 (FIG. 12) may be carried out after formation of capacitors 86, 87.

The above described inventions have the advantage of improving the patterning of metal surfaces, e.g., DRAM platinum capacitor bottom electrodes, thus allowing reduction in feature sizes and improving process yields. In addition, a bigger surface area can be processed at a time, thus reducing fabrication time and steps. Moreover the use of electroylic techniques reduces the mechanical force required to remove metal surfaces during polishing. Finally the electrolyic bath reduces cavities or scratches in processed metal surfaces.

Figure 13:
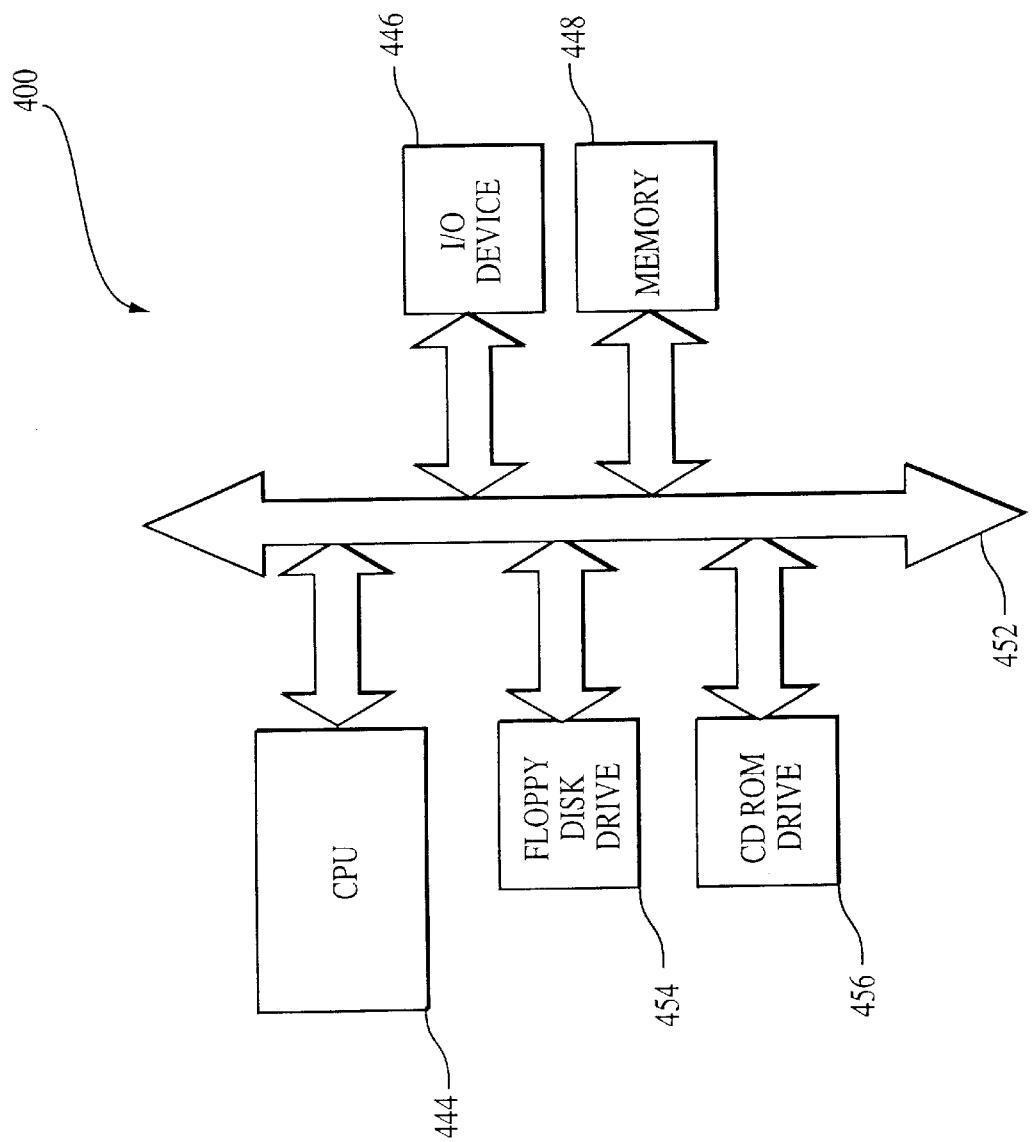
FIG. 13 is an illustration of a computer system having a memory device with at least one metal surface patterned in accordance with the present invention.

FIG. 13 shows a typical processor based system 400 which includes an DRAM memory circuit 448, containing a Metal Insulator Metal (MIM) capacitor with a metal surface fabricated according to the present invention is illustrated in FIGS. 1–12. Processor system 400 generally comprises a central processing unit (CPU) 444, e.g., a microprocessor, a digital signal processor, or other programmable digital logic device, which communicates with an input/output (I/O) device 446 over a bus 452. The memory 448 communicates with the central processing unit 444 over bus 452.

In the case of a computer system, the processor system 400 may include peripheral devices such as a floppy disk drive 454 and a compact disk (CD) ROM drive 456 which also communicate with CPU 444 over the bus 452. Memory 448 is preferably constructed as an integrated circuit, which includes at least one metal surface formed by electro-mechanical polishing as previously described in connection with FIGS. 1–12. The memory 448 may also be combined with the processor, e.g. CPU 444, on a single integrated circuit chip.

Having thus described in detail the preferred embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A method of electro-mechanically polishing a metal, said method comprising the steps of:

placing a surface of said metal in fluid communication with a second surface by placing said metal and said second surface in a fluid bath, wherein said fluid bath is an acidic solution comprising a mixture of hydrogen chloride, water, and potassium chloride;

supplying a current to the metal surface and said second surface; and moving at least one of the surfaces relative to the other.

2. The method of claim 1, wherein the metal comprises at least one metal from the group consisting of noble metals, noble metal alloys, refractory metals, and refractory metal alloys.

3. The method of claim 1, wherein the metal comprise platinum.

4. The method of claim 1, wherein the metal has a thickness of less than approximately 1000 angstroms.

5. The method of claim 1, wherein the fluid comprises at least one abrasive particle selected from the group consisting of cerium oxide ($CeO_2$), silicon oxide (SiOx), and aluminum oxide.

6. The method of claim 1, wherein the second surface comprises a conductive material.

7. The method of claim 6 wherein the second surface comprises a conductive polymer.

8. The method of claim 7, wherein said fixed abrasive particle comprises at least one abrasive particle selected from the group consisting of cerium oxide ($CeO_2$), silicon oxide (SiOx), and aluminum oxide.

9. The method of claim 6 wherein the second surface comprises a conductive oxide.

10. The method of claim 6 wherein the second surface comprises a polymer containing conductive particles.

11. The method of claim 1, wherein the second surface comprises at least one polishing surface containing abrasive materials.

12. The method of claim 1 further comprising providing a working electrode in said fluid bath.

13. The method of claim 1 wherein said second surface comprises a pad.

14. The method of claim 13 wherein said pad contains abrasive materials.

15. The method of claim 1, wherein said current supplying step is performed by applying a pulsed current to the metal surface and said second surface.

16. The method of claim 15, wherein said current is supplied for approximately 200 seconds or less.

17. The method of claim 1, wherein said current supplying step is performed by applying a constant current to the metal surface and said second surface.

18. The method of claim 1, wherein a force is applied to said surfaces, at least one of which is moving relative to the other.

19. The method of claim 1, wherein the electro-mechanically polished metal is a metal of a memory element of a semiconductor device.

20. The method of claim 1, wherein the electro-mechanically polished metal comprises at least a portion of a capacitor electrode of a DRAM memory device.

21. A method of electro-polishing at least one metal of a semiconductor device, said method comprising the steps of:

placing a surface of said metal in fluid communication with a second surface by placing said metal and said second surface in a fluid bath, said fluid bath is an acidic solution comprising a mixture of hydrogen chloride, water, and potassium chloride, wherein said mixture of hydrogen chloride and water is in a ratio of 1 to 170 saturated in said potassium chloride;

supplying a current to the metal surface and said second surface; and moving at least one of the surfaces relative to the other.

22. The method of claim 21, wherein the metal comprises at least one metal from the group consisting of noble metals, noble metal alloys, refractory metals, and refractory metal alloys.

23. The method of claim 21, wherein the semiconductor devices comprises at least one device from the group consisting of capacitor, transistor, resistor, conductor layer, conductive plug, metalization layer, gate metal, interconnect, electrode, electrical contact, electrical via, and bonding pad.

24. A method of forming a semiconductor device, comprising the steps of:

forming a conductive layer over an insulating layer;

forming a metal layer over said conductive layer;

forming a protective layer over portions of said metal layer, leaving other portions of said metal layer exposed; and electro-mechanical polishing said exposed portions of said metal layer in an acidic solution, said acidic solution comprising a mixture of hydrogen chloride, water, and potassium chloride.

25. The method of claim 24, wherein said metal layer comprises at least one metal from the group consisting of noble metals, noble metal alloys, refractory metals, and refractory metal alloys.

26. The method of claim 24, wherein said protective layer comprises a photoresist material.

27. The method of claim 24 wherein said protective layer comprises a spin on glass.

28. The method of claim 24, further comprising the step of forming an opening into said insulating layer, said conductive layer, metal layer, said protective layer being formed in said opening.

29. The method of claim 24, wherein said metal layer forms a bottom capacitor electrode of said semiconductor device.

30. A method of forming a capacitor electrode, said method comprising the steps of:

forming an electrode by depositing a metal in a container structure in electrical communication with a conductive layer;

covering an exposed surface of the metal inside said container with a protective material;

placing the exposed surface of the metal in fluid communication with a second surface by placing the exposed metal surface and said second surface in a fluid bath, wherein said fluid bath is an acidic solution comprising a mixture of hydrogen chloride, water, and potassium chloride;

supplying a current to the metal surface and said second surface; and moving at least one of the surfaces relative to the other.

31. The method of claim 30, wherein said capacitor electrode is a bottom electrode.

32. A method of forming a lower electrode of a capacitor on a semiconductor substrate, comprising the steps of:

forming a first opening into a first insulating layer provided over said semiconductor substrate;

forming a conductive plug in said first opening;

forming a second insulating layer over said conductive plug and said first insulating layer;

forming a second opening into said second insulating layer over said conductive plug;

forming a metal layer in said opening and over at least a portion of said second insulating layer;

forming a protective layer over portions of said metal layer, leaving other portions of said metal layer exposed; and electro-mechanical polishing said exposed portions of said metal layer in an acidic solution, said acidic solution comprising a mixture of hydrogen chloride, water, and potassium chloride.

33. The method of claim 32, wherein said electrode comprises at least one metal from the group consisting of noble metals, noble metal alloys, refractory metals metal, and refractory metal alloys.

* * * * *

UNITED STATES PATENT AND TRADEMARK OFFICE
CERTIFICATE OF CORRECTION

PATENT NO.    : 6,605,539 B2
DATED         : August 12, 2003
INVENTOR(S)   : Whonchee Lee et al.

It is certified that error appears in the above-identified patent and that said Letters Patent is hereby corrected as shown below:

<u>Title page</u>,
Item [57], ABSTRACT,
Line 2, "described" should read -- disclosed --

Signed and Sealed this

Ninth Day of March, 2004

JON W. DUDAS
*Acting Director of the United States Patent and Trademark Office*